(12) United States Patent  (10) Patent No.: US 7,870,467 B2
Yoshida  (45) Date of Patent: Jan. 11, 2011

(54) DATA CONVERTER, INFORMATION RECORDER, AND ERROR DETECTOR

(75) Inventor: Kenji Yoshida, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 12/267,510

(22) Filed: Nov. 7, 2008

(65) Prior Publication Data

US 2009/0276688 A1    Nov. 5, 2009

(30) Foreign Application Priority Data

Apr. 30, 2008    (JP) .............................. 2008-119371

(51) Int. Cl.
   *H03M 13/00* (2006.01)
(52) U.S. Cl. ................. 714/781; 714/755; 714/799
(58) Field of Classification Search ................ 714/755, 714/781, 799
   See application file for complete search history.

(56) References Cited

U.S. PATENT DOCUMENTS

| 5,781,131 | A * | 7/1998 | Shimpuku et al. ............. 341/58 |
| 6,504,493 | B1 * | 1/2003 | Burd ............................. 341/50 |
| 6,684,363 | B1 * | 1/2004 | Cassiday et al. ............. 714/776 |
| 6,931,581 | B1 * | 8/2005 | Cassiday et al. ............. 714/758 |
| 7,231,582 | B2 * | 6/2007 | Worley ........................ 714/773 |
| 7,266,760 | B1 * | 9/2007 | Bain ........................... 714/807 |
| 7,296,215 | B2 | 11/2007 | Izumita et al. |
| 7,328,396 | B2 * | 2/2008 | Mann .......................... 714/781 |

2008/0123783 A1    5/2008  Yoshida

FOREIGN PATENT DOCUMENTS

| JP | 04-057256 | 2/1992 |
| JP | 11-191268 | 7/1999 |
| JP | 11-249821 | 9/1999 |
| JP | 2000-040081 | 8/2000 |
| JP | 2000-306342 | 11/2000 |
| JP | 2001-023316 | 1/2001 |
| JP | 2005-064608 | 3/2005 |
| JP | 2008-004195 | 10/2008 |

OTHER PUBLICATIONS

Notice of Rejection for the Japanese patent application mailed by Japan Patent Office on Jul. 14, 2009.

* cited by examiner

*Primary Examiner*—Esaw T Abraham
(74) *Attorney, Agent, or Firm*—Knobbe, Martens, Olson & Bear LLP (57) ABSTRACT

A data converter includes: an input module to which a first data series is input, the first data series having a first data sequence and a first error detection code corresponding to a remainder of division of the first data sequence by a predetermined polynomial; a conversion module converting the first data sequence into a second data sequence by processing including one of insertion, exchange, and inversion of a bit or a bit sequence, and exclusive-OR with a predetermined bit or bit sequence; a processing bit sequence generation module generating a processing bit sequence corresponding to the processing; and a code generation module generating a second error detection code corresponding to the second data sequence based on an exclusive-OR of the generated processing bit sequence and the first error detection code.

13 Claims, 9 Drawing Sheets

DATA CONVERTER, INFORMATION RECORDER, AND ERROR DETECTOR

CROSS-REFERENCE TO RELATED APPLICATIONS

This application is based upon and claims the benefit of priority from the prior Japanese Patent Application No. 2008-119371, filed on Apr. 30, 2008; the entire contents of which are incorporated herein by reference.

BACKGROUND OF THE INVENTION

1. Field of the Invention

The present invention relates to a data converter converting an input data sequence into an output data sequence of a different series, an information recorder, and an error detector.

2. Description of the Related Art

Conventionally, there has been a technique for detecting an error based on an error detection code such as CRC (Cyclic Redundancy Check) or the like appended to an input data sequence. This technique sometimes uses a converter circuit converting the input data sequence, for example, a run length limited coding circuit, a MTR (Maximum Transition Run) coding circuit, or a converter circuit dividing data into blocks and inserting a parity bit. In this case, data input to the converter circuit are checked on an input side of the converter circuit based on the error detection code. Then, another error detection code is generated for data output from the converter circuit and the output data with this error detection code is transmitted. Further, there has conventionally been disclosed a technique in which each symbol in an input data sequence is exclusive-OR operated with a particular symbol having a pattern not identical with any of these symbols, and the operation result is output together with the particular symbol (JP-A 2008-004195 (KOKAI), see ABSTRACT).

BRIEF SUMMARY OF THE INVENTION

In the error detection techniques described above, the error detection code for the output data series cannot be generated without using data generated by the conversion. As a result, if the sameness between the data input to the converter circuit and the data output from the converter circuit is impaired due to a data conversion error accompanying a trouble or the like of a LSI (integrated circuit, here the converter circuit) configured with a transistor, this data cannot be detected. In view of the above, it is an object of the present invention to provide a data converter generating an error detection code for an output data series without using data generated by the conversion, an information recorder, and an error detector.

A data converter according to an aspect of the present invention includes: an input module to which a first data series is input, the first data series having a first data sequence and a first error detection code corresponding to a remainder of division of the first data sequence by a predetermined polynomial; a conversion module converting the first data sequence into a second data sequence by processing including one of insertion, exchange, and inversion of a bit or a bit sequence, and exclusive-OR with a predetermined bit or bit sequence; a processing bit sequence generation module generating a processing bit sequence corresponding to the processing; and a code generation module generating a second error detection code corresponding to the second data sequence based on an exclusive-OR of the generated processing bit sequence and the first error detection code.

An information recorder according to another aspect of the present invention includes: a data converter and a writing module, the data converter comprising: an input module to which a first data series is input, the first data series having a first data sequence and a first error detection code corresponding to a remainder of division of the first data sequence by a predetermined polynomial; a conversion module converting the first data sequence into a second data sequence by processing including one of insertion, exchange, and inversion of a bit or a bit sequence, and exclusive-OR with a predetermined bit or bit sequence; a processing bit sequence generation module generating a processing bit sequence corresponding to the processing; and a code generation module generating a second error detection code corresponding to the second data sequence based on an exclusive-OR of the generated processing bit sequence and the first error detection code, and the writing module writing, to a recording medium, a data series having the second data sequence and the second error detection code or a third error detection code.

An error detector according to still another aspect of the present invention includes: an input module to which a data series having a data sequence and an error detection code for the data sequence is input, the data sequence generated by conversion including insertion of a bit or a bit sequence; an extraction module extracting the bit or the bit sequence from the data series; and a detection module detecting presence or absence of an error in the data sequence generated by conversion, based on the extracted bit or bit sequence and the error detection code.

DETAILED DESCRIPTION OF THE INVENTION

Hereinafter, embodiments of the present invention will be described in detail.

First Embodiment

Figure 1:
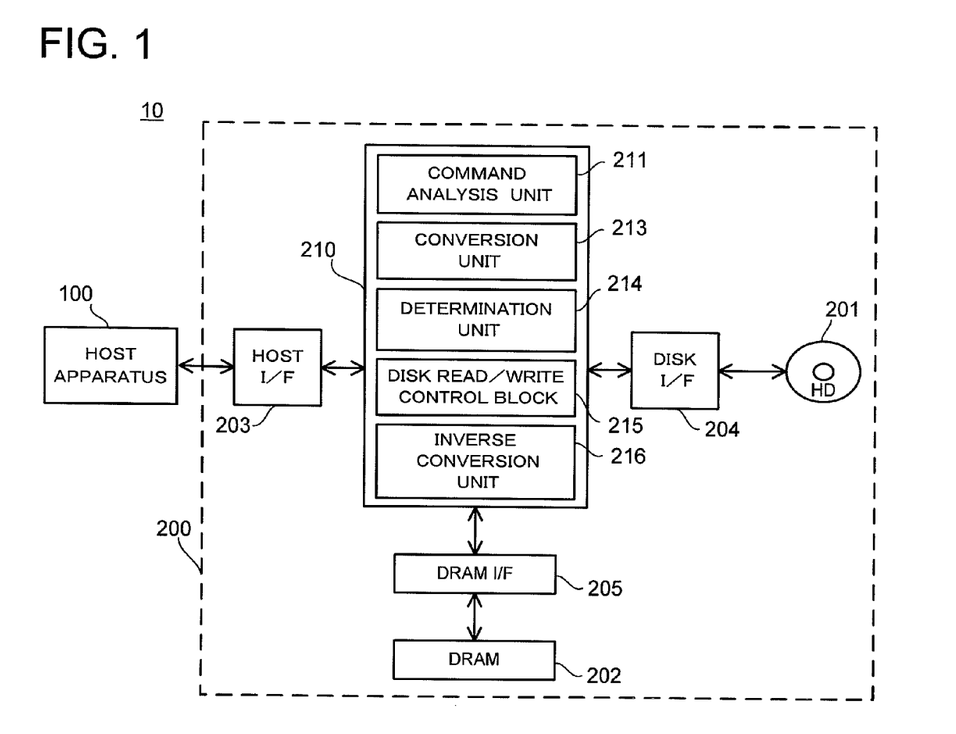
FIG. 1 is a block diagram showing an information recording system according to a first embodiment of the present invention.

FIG. 1 is a block diagram showing an information recording system 10 according to a first embodiment of the present invention. The information recording system 10 includes a host apparatus 100 and an information recorder 200.

The information recorder 200 includes a hard disk (HD) 201, a DRAM (dynamic semiconductor memory) 202, a host interface (I/F) 203, a disk interface (I/F) 204, a DRAM interface (I/F) 205, and a hard disk controller (HDC) 210.

The host apparatus 100 writes and reads information to/from the information recorder 200, and is, for example, a control unit in a personal computer. The host apparatus 100 is capable of sending commands to the HDC 210 via the host interface 203. The host apparatus 100 is further capable of receiving data from the HDC 210 via the host interface 203.

The HDC 210 is capable of exchanging data with the HD 201 and the DRAM 202 via the disk interface 204 and the DRAM interface 205 respectively. When an amount of the data stored in the DRAM 202 reaches a predetermined amount, the HDC 210 sends the data to the HD 201. An error detection code is appended to the data which is to be recorded in the HD 201, which enables error correction when the data is reproduced.

The HD 201 has a magnetic disk, a spindle motor, a magnetic head, and an arm. The magnetic disk is a recording medium for information recording. The spindle motor rotates the magnetic disk. The magnetic head writes/reads data to/from the magnetic disk. The arm holds the magnetic head to move the magnetic head on the magnetic disk.

The DRAM 202 is used as a buffer when data is recorded to the HD 201. Data which is to be written from the host apparatus 100 to the HD 201 is written via the DRAM 202. Further, data which is to be read from the HD 201 to the host apparatus 100 side is read via the DRAM 202. Further, the DRAM 202 stores an area management table and an address translation table.

The HDC 210 has a command analysis unit 211, a conversion unit 213, a determination unit 214, a disk read/write control block 215, and an inverse conversion unit 216.

The command analysis unit 211 analyzes the commands sent from the host apparatus 100. The commands include a data write command, a data read command, a data transfer command, a memory information read command, and so on. The command analysis unit 211 detects the write command sent from the host apparatus 100.

The conversion unit 213 converts an input data series input from the DRAM 202 into an output data series of a different series. The conversion unit 213 converts data input from the DRAM 202 to output a data series suitable for magnetic recording/reproduction. The input data series is a first data series, and the output data series is a second data series. A detailed structure of the conversion unit 213 will be described later.

The determination unit 214 determines whether or not the input data input to the conversion unit 213 and the output data output from the conversion unit 213 are identical, thereby ensuring the sameness of the both data.

The disk read/write control block 215 writes/reads data to/from the HD 201 and the DRAM 202. When an amount of the data written in the DRAM 202 reaches a predetermined amount, the disk read/write control block 215 outputs, to the disk interface 204, a command for data write to the HD 201. Further, the disk read/write control block 215 deletes data from the HD 201 and the DRAM 202. The disk interface 204 has a structure of a writing module which writes the data in the DRAM 202 to the HD 201 based on the write command.

The disk read/write control block 215 encodes the data output by the conversion unit 213 by using an error correction code to generate data which is to be recorded to the HD 201. Further, when reproduced data is input thereto from the HD 201, the disk read/write control block 215 decodes the data by using an error correction code to output data which is to be input to the inverse conversion unit 216.

The inverse conversion unit 216 is a circuit performing conversion which is inverse to the conversion by the conversion unit 213. That is, it restores the original data from the reproduced data series suitable for the magnetic recording and reproduction.

Figure 2:
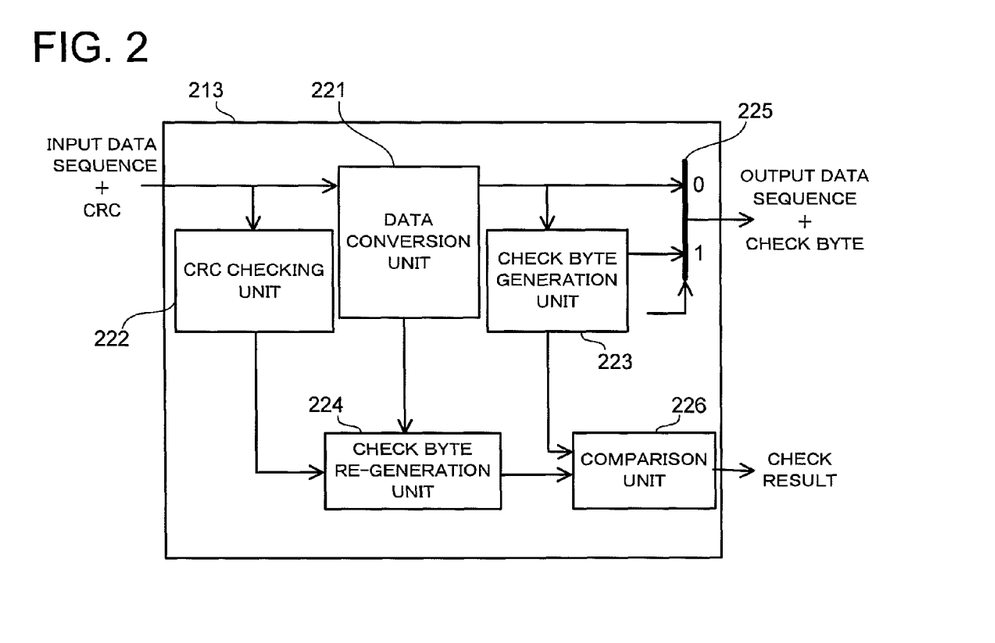
FIG. 2 is a block diagram showing a conversion unit shown in FIG. 1.

FIG. 2 is a block diagram showing the conversion unit shown in FIG. 1. The conversion unit 213 has a data conversion unit 221, a CRC checking unit 222, a check byte generation unit 223, a check byte re-generation unit 224, a selector unit 225, and a comparison unit 226. The conversion unit 213 further has a not-shown counter. A wiring line to which the conversion unit 213 is connected functions as an input module to which the input data series is input. The counter counts input data sequences. The conversion unit 213 converts the input data sequence input from the DRAM 202 into an output data sequence of a predetermined series. Here, a check byte means an error detection code generated dedicatedly for the data series output by the data conversion unit 221. Methods of generating and detecting the check byte will be described later.

A series generated by the conversion by the data conversion unit 221 according to the first embodiment has a controlled DC component and satisfies run length limitation. Here, this series is called a DCCRLL (Direct Current Controlled Run Length Limited) series.

In the conversion by the data conversion unit 221, a particular pattern P not included in a data sequence masks the data sequence as an input series or an inverted series resulting from the inversion of the input series. Further, in this conversion, inversion information bits indicating whether the data is of the input series or the inversion series are inserted in predetermined positions of the data sequence. That is, the data conversion unit 221 performs one of the following operations (1) to (3).

(1) It performs an XOR (exclusive-OR) operation on the particular pattern P and the input data sequence to output the result.

(2) It performs an XOR operation on the particular pattern P and the inverted input data sequence to output the result.

(3) It inserts the inversion information bits in the input data sequence.

The data conversion unit 221 functions as a conversion module converting the input data sequence into the output data sequence. The data conversion unit 221 further functions as a processing bit sequence generation module generating data corresponding to the processing (processing bit sequence).

The CRC checking unit 222 is provided in an input series side of the data conversion unit 221. The CRC checking unit 222 detects and checks a CRC value appended to the input data sequence. This CRC value is output from the CRC checking unit 222 to the check byte re-generation unit 224.

The check byte generation unit 223 is provided in an output series side of the data conversion unit 221. The check byte generation unit 223 generates information of the output-series check byte for the output data sequence. The information of the check byte is output to the selector unit 225 and the comparison unit 226. A detailed structure of the check byte generation unit 223 will be described later.

The check byte re-generation unit 224 functions as a code generation module generating the information of the check byte on the output side, based on the CRC value on the input side, the pattern P, bit information of the inversion information bits. The information of the check byte is output to the comparison unit 226. Details of the check byte re-generation unit 224 will be described later.

The selector unit 225 selectively outputs the output data sequence and the information of the check byte. The selector unit 225 selects and outputs the output data sequence or the information of the check byte, based on a signal from a not-shown counter counting bit positions of the output data sequence. The selector unit 225 has a structure of a data series generation module which generates the output data series by appending the information of the check byte to the output data sequence.

The comparison unit 226 functions as a comparison module which compares the bit information of the check byte input from the check byte generation unit 223 and that input from the check byte re-generation unit 224 to determine whether or not they are identical. The comparison unit 226 outputs a check result according to the comparison to the determination unit 214 so that the determination unit 214 can permit or prohibit the write of the output data sequence to the HD 201. Alternatively, the check result may be directly output to the disk read/write control block 215 so that the disk read/write control block 215 can determine the aforesaid write permission and write prohibition.

Figure 3:
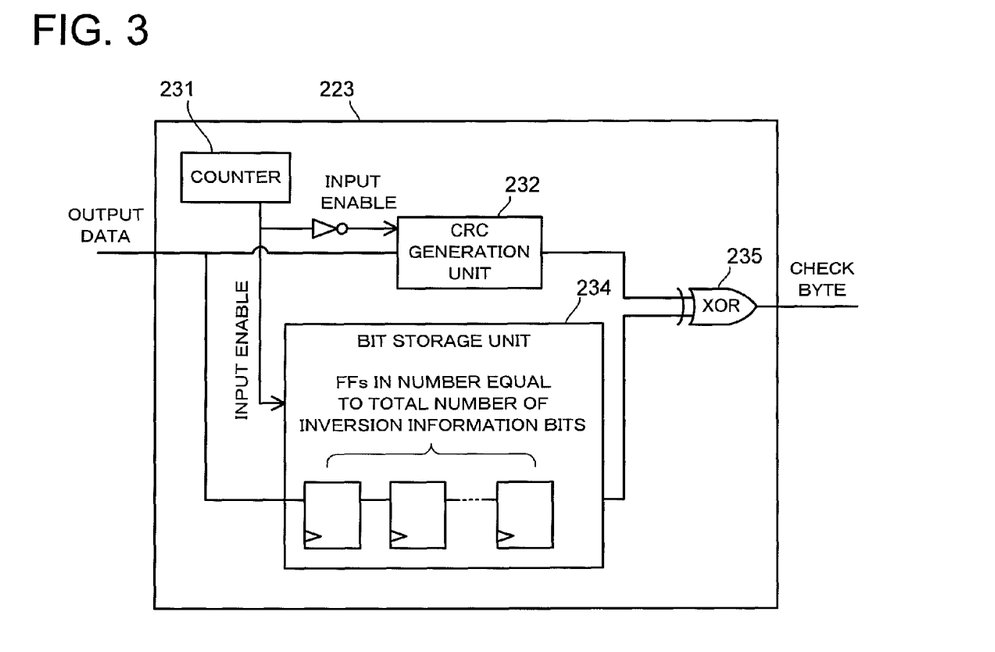
FIG. 3 is a block diagram showing a check byte generation unit shown in FIG. 2.
Figure 4:
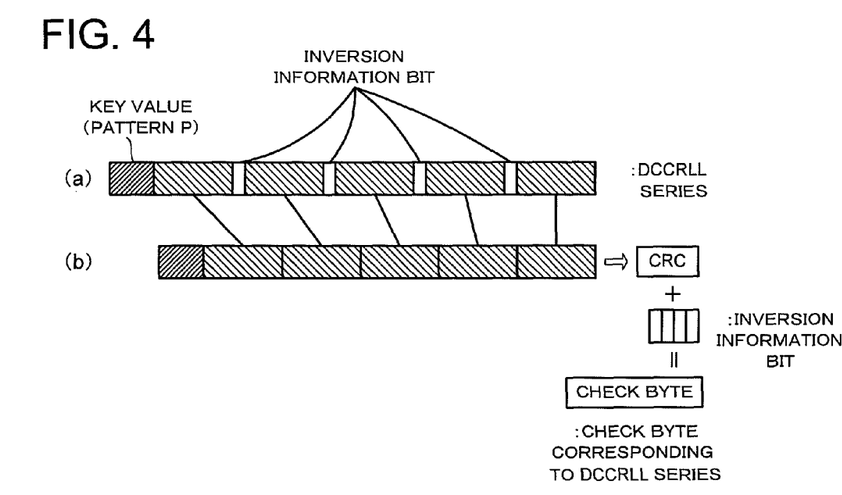
FIG. 4 is a chart showing the structures of data sequences in order to illustrate check byte generation according to the first embodiment of the present invention.

FIG. 3 is a block diagram showing the check byte generation unit 223 shown in FIG. 2. The check byte generation unit 223 is provided in the output series side of the conversion unit 213. The check byte generation unit 223 includes a counter 231, a CRC generation unit 232, a bit storage unit 234, and an XOR (exclusive-OR) operation unit 235. The check byte generation unit 223 functions as a second code generation module which generates, from the data sequence of the DCCRLL series (see (a) in FIG. 4), the check byte for the output data sequence (see (b) in FIG. 4) that the data conversion unit 221 generates by converting. The hatched portions in FIG. 4 are data sequences divided into blocks with a predetermined number of bits.

The counter 231 is a counter counting the output data. By this counting, the counter 231 is capable of determining the positions of the blocks to which the data sequence is divided, the insertion positions of the inversion information bits between the blocks, and the number of output bits of the output data that the data conversion unit 221 generates by the processing.

The CRC generation unit 232 has flip-flops (FF) in number corresponding to the number of bits of the CRC. The CRC generation unit 232 functions as a second remainder calculation module which divides a divided data sequence, which is the output data sequence from which the inversion information bits are removed, by a generator polynomial, thereby generating a remainder of the output data sequence (CRC code value). The CRC generation unit 232 shifts data according to an input enable from the counter 231. When a bit currently input is not a bit where the inversion information bit is inserted, the counter unit 231 causes the CRC generation unit 232 to receive 1-bit data. The CRC generation unit 232 operates only when the output data sequence with the inversion information bit being removed is input.

The bit storage unit 234 is a shift register having FFs in number corresponding to the total number of the inversion information bits. The bit storage unit 234 shifts the inversion information bit according to an input enable from the counter 231. When a bit currently input is a bit where the inversion information bit is inserted, the counter 231 causes the bit storage unit 234 to receive data of the inversion information bit. The bit storage unit 234 operates only when the inversion information bit is input.

When the input of all the data in the output data sequence is finished, the XOR operation unit 235 XOR-operates the CRC value (for example, 16 bits) from the CRC generation unit 232 with the inversion information bits (for example, 8 bits) from the bit storage unit 234. The XOR operation unit 235 outputs, to the selector unit 225, the information of the check byte which is the result of the XOR operation. The XOR operation unit 235 calculates an exclusive-OR of the CRC and the inversion information bits from the bit storage unit 234.

Figure 5:
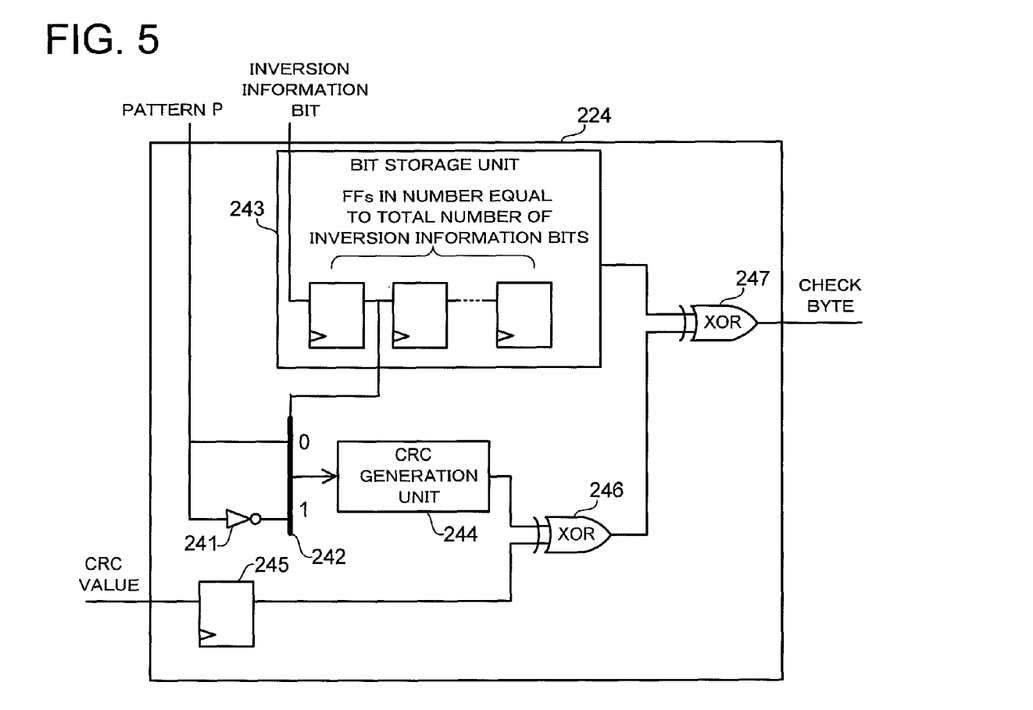
FIG. 5 is a block diagram showing a check byte re-generation unit shown in FIG. 2.

FIG. 5 is a block diagram showing the check byte re-generation unit 224 shown in FIG. 2. The check byte re-generation unit 224 is provided in an input series side of the conversion unit 213. The check byte re-generation unit 224 includes an inverter 241, a selector unit 242, a bit storage unit 243, a CRC generation unit 244, a FF 245, an XOR 246, and an XOR 247. Further, the check byte re-generation unit 224 has a predetermined counter. The counter is a counter counting data. By this counting, the counter can determine the positions of the blocks to which the data is divided, the insertion positions of the inversion information bits between the blocks, and the number of input bits of the input data. The check byte re-generation unit 224 XOR-operates the CRC value and a CRC generated by the CRC generation unit 244 to generate a CRC in (b) in FIG. 4. Further, the check byte re-generation unit 224 XOR-operates this generated CRC and the inversion information bits from the bit storage unit 243 to generate the check byte (see (b) in FIG. 4).

The inverter 241 inverts the input pattern P to obtain inversion data. The inverter 241 is connected to a 1-side of the selector unit 242.

The selector unit 242 selectively takes in the pattern P and the inversion data. The selector unit 242 selects the pattern P or the inversion data based on the inversion information bit from the bit storage unit 243.

The bit storage unit 243 is a shift register having FFs in number equal to the total number of the inversion information bits. The bit storage unit 243 shifts data based on the input inversion information bits. The bit storage unit 243 holds bits or bit sequences inserted in predetermined positions.

The CRC generation unit 244 has FFs in number equal to the number of bits of the CRC. The CRC generation unit 244 divides the pattern P or the inversion data of the pattern P selected by the selector unit 242, by a generator polynomial, thereby generating a remainder (CRC value). The CRC generation unit 244 generates the CRC value by dividing each bit sequence by the generator polynomial. The CRC generation unit 244 has the same structure as that of the CRC generation unit 232 shown in FIG. 3.

The flip-flop (FF) 245 is composed of flip-flops in number equal to the number of bits of the CRC. The FF 245 holds the CRC value input from the CRC checking unit 222 to output the CRC value to the XOR 246.

The XOR 246 performs an exclusive-OR operation on the CRC value from the CRC generation unit 244 and the CRC value from the FF 245. The XOR 247 performs an exclusive-OR operation on the inversion information bits from the bit storage unit 243 and the operation result (CRC value) from the XOR 246, thereby generating the check byte. The XOR 246 and the XOR 247 function as a logical operation module performing the XOR operation on the plural CRC values.

Next, the operation procedure of the information recorder 200 will be described.

The command analysis unit 211 detects the write command sent from the host apparatus 100. Specifically, the write command instructing data write is sent from the host apparatus 100 to the controller 210 to be detected by the command analysis unit 211. The command is attached to write data.

The conversion unit 213 performs the DCCRLL data conversion in response to a data conversion command from the command analysis unit 211. At the same time, the conversion unit 213 detects an error in the data by using the check byte generation unit 223 and the check byte re-generation unit 224.

Figure 6:
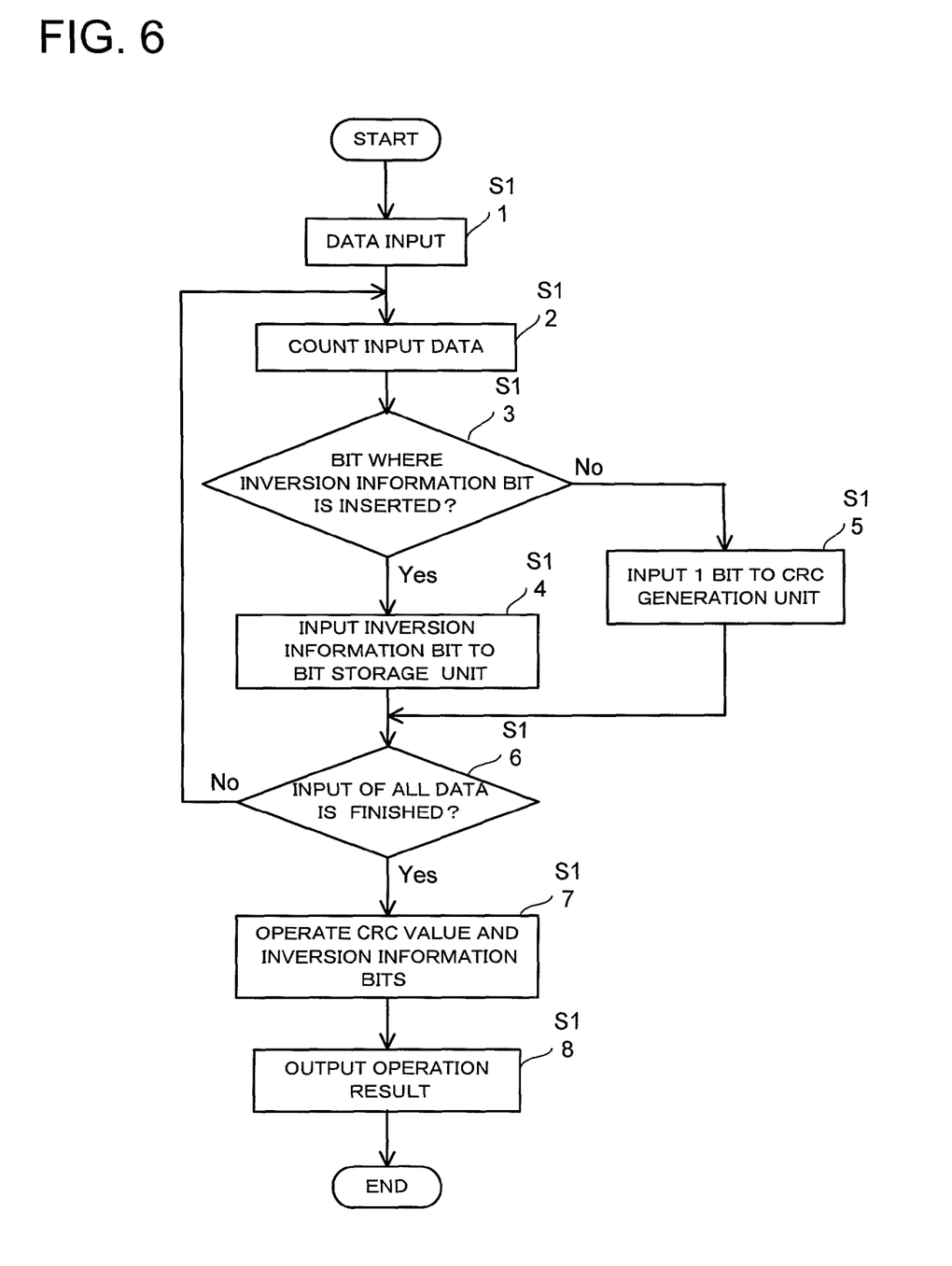
FIG. 6 is a flowchart showing an example of the operation procedure of the check byte generation unit.

FIG. 6 is a flowchart showing an example of the operation procedure of the check byte generation unit 223.

When data is input (Step S11), the counter 231 counts the input data (Step S12).

The counter 231 determines whether or not the input bit is a bit where the inversion information bit is inserted (Step S13). The counter 231 performs the counting operation the number of times equal to the number of bits where the inversion information bits are inserted. Then, when the input bit is a bit where the inversion information bit is inserted, the counter 231 causes the bit storage unit 234 to receive the inversion information bit (Step S14).

On the other hand, when the input bit is not a bit where the inversion information is inserted, the counter 231 causes the CRC generation unit 232 to receive 1-bit data (Step S15). The above operation is repeated until the input of all the data is finished (Step S16).

Then, when the input of all the data is finished, the XOR operation unit 235 XOR-operates the CRC value (for example, 16 bits) generated by the CRC generation unit 232 and the inversion information bits (for example, 8 bits) stored in the bit storage unit 234 (Step S17). Then, the XOR operation unit 235 outputs the check byte as the operation result to the selector unit 225 (Step S18).

Generally, the conversion operation can include the combination of the following processing operations (1) to (4). The operation of the data conversion unit 221 of this embodiment can be described also as the combination of these processing operations (1) to (4).

Processing (1): XOR operation on a particular pattern P and data
Processing (2): exchange between a particular bit position and a particular bit position
Processing (3): inversion of input data in a particular bit position
Processing (4): insertion of a bit in a particular bit position Codes (for example, the CRC values) corresponding to the processing (1) to the processing (3) are calculated respectively. A bit sequence inserted in correspondence to the processing (4) is stored. A code before the processing is XOR-operated with the aforesaid codes or the stored bit sequence. As a result, the check byte which is an error detection code after the conversion processing can be calculated.

For the processing (1), in the position of the bit to undergo the XOR operation, an actually operated pattern is substituted. Data in which a bit not subjected to the XOR operation is set to zero is generated, and an error detection code (for example, the CRC value) for this data is calculated. Incidentally, in a case where the particular pattern P is inverted, the inverted pattern is another particular pattern and thus this case belongs to this category. Further, when the XOR operation is performed on the inverted original data and the pattern P, this XOR operation is equivalent to the XOR operation on the original data and "the inverted pattern P" and thus belongs to this category.

For the processing (2), only when these two bits are different, places corresponding to the two particular bit positions are set to "1". In a case where bits are not exchanged or in a case where bits are exchanged but this exchange is actually exchange of data such as "0" and "0" or "1" and "1", an error detection code (for example, the CRC value) of data where places corresponding to positions of these bits are set to "0" is calculated. The processing (2) is also a kind of the processing (1).

For the processing (3), a place corresponding to this bit position is set to "1". An error detection code (for example, the CRC value) of data in which places corresponding to the other bit positions are set to "0" is calculated. The processing (3) is also a kind of the processing (1).

For the processing (4), this bit is held. Specifically, this bit becomes a target of the XOR operation as it is and an error detection code (for example, the CRC value) is not calculated.

An error detection code before the processing is XOR-operated with each of the error detection codes calculated by the processing (1) to the processing (4) or the held bit sequence. As a result, the check byte being the error detection code after the conversion processing can be calculated. When the combination of a plurality of processing operations among these processing (1) to processing (3) is performed, the check byte is calculated by the XOR operation of these (the pattern P of the processing (1) and the processing (2), or the pattern P of the processing (1) and the processing (3)).

In this manner, after the pattern P is inverted in the check byte generation unit 223, the XOR operation is performed. The operation during which the inversion information bit is inserted means that the combination of the processing (1) and the processing (4) is executed.

When the number of the inserted bits exceeds the number of bits of the CRC, another CRC generation unit parallel to the CRC generation unit 232, for instance, is provided in the check byte generation unit 223. The check byte generation unit 223 may make the other CRC generation unit also receive a data sequence of the inserted bits to perform an XOR operation on the CRC values of the both CRC generation units. Further, the error detection code is not limited to the CRC but may be any code calculated by division of the data by the polynomial.

Further, when the conversion procedure includes the combination of a plurality of processing operations among the aforesaid processing (1) to processing (3), one CRC generation circuit is shared instead of providing CRC generation circuits separately for the respective processing operations. By first XOR-operating the input data sequences by the shared CRC generation circuit, it is possible to generate a value which is the result of the XOR of the generated CRC values. That is, combining the plural processing operations among the processing (1) to the processing (3) means that there are a plurality of data sequences which are to be XOR-operated with the original data sequence. Therefore, by first XOR-operating the data sequences which are to be XOR-operated, the number of the data sequences to be XOR-operated with the original data sequence can be reduced to one.

Figure 7:
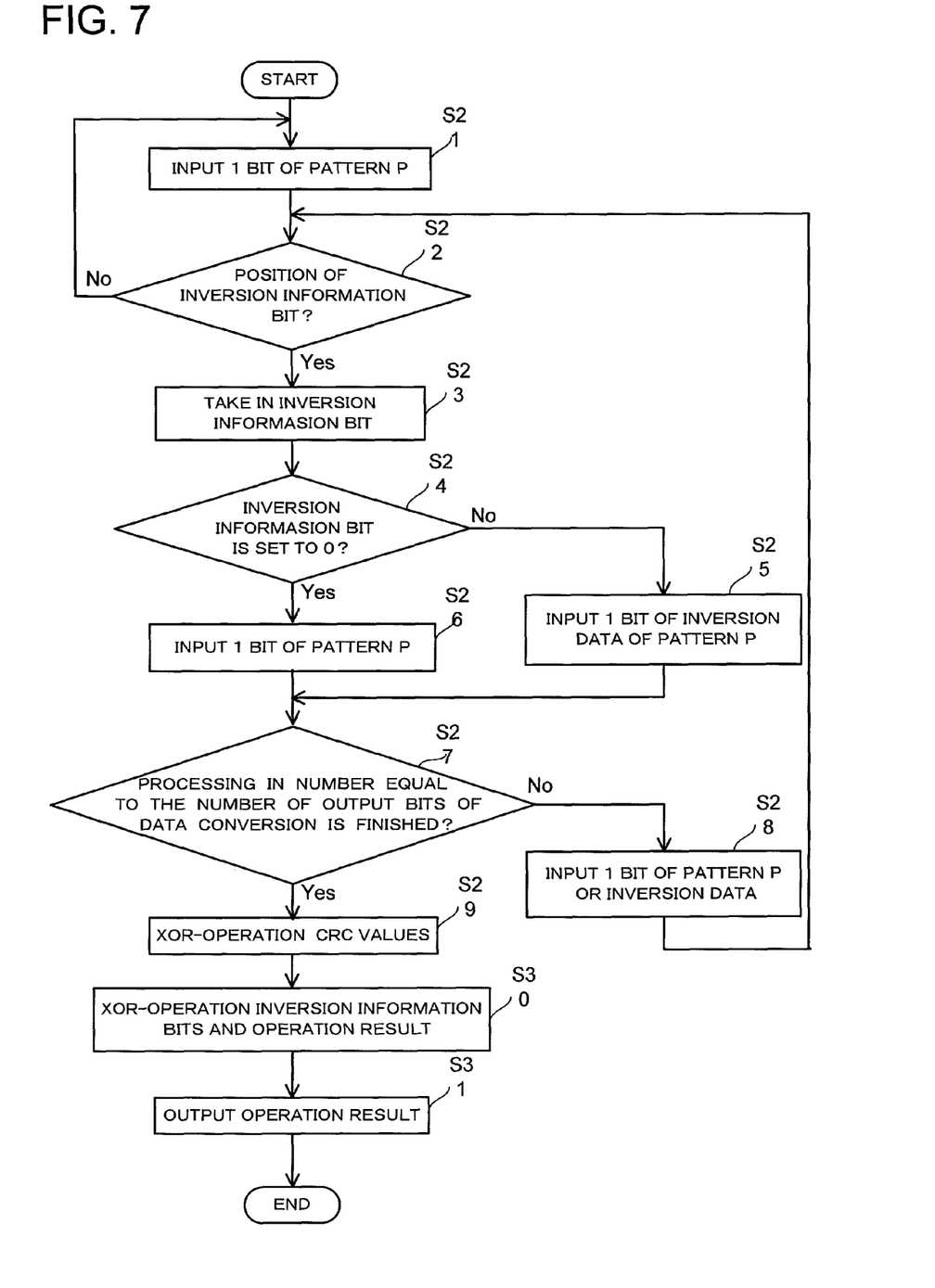
FIG. 7 is a flowchart showing an example of the operation procedure of the check byte re-generation unit.

FIG. 7 is a flowchart showing an example of the operation procedure of the check byte re-generation unit 224.

It is assumed here that the pattern P and the inversion information bit sequence are input from the data conversion unit 221 to the check byte re-generation unit 224. Further, the CRC of the input data is checked by the CRC checking unit 222 at an instant when the input data is input to the data conversion unit 221. It is assumed that the checked CRC value is input to the check byte re-generation unit 224.

In the check byte re-generation unit 224, the pattern P is input bit by bit to the CRC generation unit 244 via the selector unit 242 (Step S21). The CRC generation unit 244 first receives the pattern P itself bit by bit in sequence. Here, the data conversion unit 221 divides the data into the plural blocks to insert the inversion information bits between the blocks. However, it is known that the head block is not inverted. Therefore, the check byte re-generation unit 224 makes the CRC generation unit 244 receive the pattern P corresponding to the number of bits of the head block. The 1-bit input of the pattern P is performed based on the counting operation of the not-shown counter.

Next, the check byte re-generation unit 224 determines whether or not a currently input bit is at a position of the inversion information bit (Step S22). Here, when the position of the inversion information bit is reached, the check byte re-generation unit 224 takes the inversion information bit into the bit storage unit 243 (Step S23). Then, when the inversion information bit is set to 1, that is, it indicates the inversion (Step S24), the selector 242 sequentially inputs the inversion data of the pattern P, which is input from the inverter 241, bit by bit to the CRC generation unit 244 (Step S25).

On the other hand, when the inversion information bit is 0, the selector unit 242 inputs the pattern P as it is bit by bit to the CRC generation unit 244 (Step S26).

The pattern P or the inversion data of the pattern P in number corresponding to (the number of bits of the input series not including the inversion information bits)+(the number of the bits of the patterns P input first) is input to the CRC generation unit 244.

Next, the check byte re-generation unit 224 determines whether or not all the inversion information bits have been input and the processing in number equal to the number of output bits of the data conversion unit 221 has been finished (Step S27). The check byte re-generation unit 224 receives all the inversion information bits. Then, it receives the aforesaid pattern P or inversion data bit by bit until the processing in number equal to the number of the output bits is finished (Step S28).

Then, all the inversion information bits are input, and the processing corresponding to the number of the output bits is finished. When this processing is finished, the XOR operation unit 246 XOR-operates the CRC value (for example, 16 bits) generated by the CRC generation unit 244 and the original CRC value from the CRC checking unit 222 (Step S29).

Further, the XOR operation unit 247 XOR-operates the CRC value being the result of this XOR operation and the inversion information bits from the bit storage unit 243 (Step S30). The XOR operation unit 247 outputs the check byte being the result of this operation to the comparison unit 226 (Step S31).

The comparison unit 226 receives bit information of the check byte from the check byte generation unit 223 and the bit information of the check byte from the check byte re-generation unit 224. The comparison unit 226 compares whether these pieces of the bit information of the check bytes are identical or not, and outputs the check result to the determination unit 214.

Such an operation by the check byte re-generation unit 224 performing the XOR after inverting the pattern P means that the combination of the processing (1) and the processing (3) is executed.

By this operation, the CRC value generated by the CRC generation unit 244 and stored patterns of the inversion information bits generated by the bit storage unit 243 are XOR-operated. This XOR operation can find a change/difference value from the CRC value input from the CRC checking unit 222. Incidentally, when some bit pattern is inserted in the head of the data sequence, the insertion may be executed in the aforesaid processing (1) or in the aforesaid processing (4). In this embodiment, the insertion of the particular pattern P in the head is executed in the processing (1).

As a result of such processing, the check byte of the output data series can be generated without using data obtained after the conversion.

Further, the check byte of the output data series is generated also by using the data obtained after the conversion. As a result, it is possible to determine whether or not the two separately generated check bytes are identical. Based on this determination, a data conversion error in the data conversion unit 221 can be accurately detected.

Further, along with the determination on whether the check bytes are identical, the CRC checking unit 222 detects an error in the input data sequence. As a result, it is possible to accurately detect the data conversion error in the data conversion unit 221 while ensuring reliability of the input data.

In the description of this embodiment, a series generated bathe conversion by the data conversion unit 221 is the DCCRLL series. However, the present invention is not limited to this and is applicable to, for example, a series using a parity check code.

Second Embodiment

A second embodiment of the present invention will be described.

Figure 8:
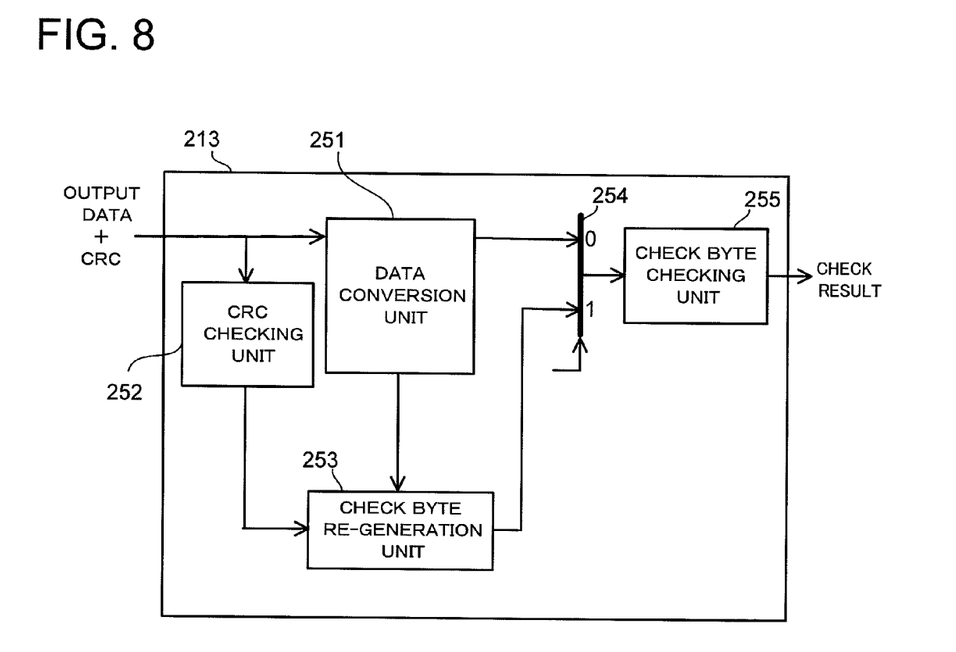
FIG. 8 is a diagram showing a conversion unit according to a second embodiment of the present invention.

FIG. 8 is a diagram showing a conversion unit according to the second embodiment of the present invention. This conversion unit 213 is different from the conversion unit in FIG. 2 in that a check byte re-generation unit 253 functioning as a code generation module is connected to a selector unit 254, and in that an output of the selector unit 254 is input to a check byte checking unit 255. The selector unit 254 has a structure of a data series generation module which generates an output data series by appending information of a check byte to an output data sequence.

The conversion unit 213 generates a data sequence in which an output of the check byte re-generation unit 253 is appended to an output of a data conversion unit 251 which functions as a conversion module and as a processing bit sequence generation module. Then, the detection is performed for this data sequence.

Figure 9:
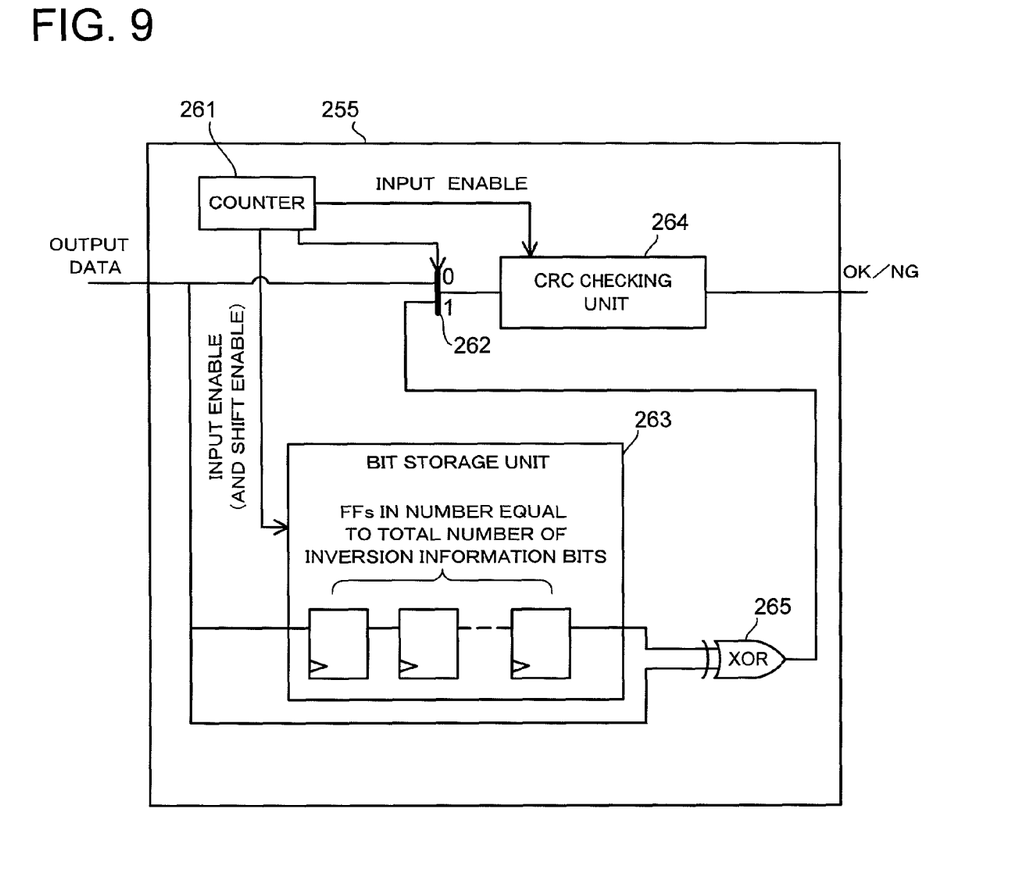
FIG. 9 is a diagram showing a check byte checking unit shown in FIG. 8.

FIG. 9 is a diagram showing the check byte checking unit shown in FIG. 8. The check byte checking unit 255 includes a counter 261, a selector unit 262, a bit storage unit 263, a CRC checking unit 264, and an XOR operation unit 265. The check byte checking unit 255 aligns positions of the bit information of the check byte from the check byte re-generation unit 253 and bit information of inversion information bits of the bit storage unit 263 to perform an XOR operation on these pieces of the bit information, thereby generating A (error detection code, here a CRC) in FIG. 10. Further, the check byte checking unit 255 performs the regular error detection (here, error detection based on the CRC) based on the data sequence, which is obtained as a result of removing inserted bits from the data series input thereto, and the generated CRC value (A in FIG. 10). Therefore, the check byte checking unit 255 can perform the error detection with the same level of accuracy as the CRC. The check byte checking unit 255 functions as an error detection module detecting an error by using the bit information of the check byte from the check byte re-generation unit 253.

The counter 261 is a counter counting output data from the selector unit 254. By this counting, the counter 261 can determine the insertion positions of the inversion information bits and the number of output bits of the output data processed by the data conversion unit 251.

The selector unit 262 selects the output data sequence and the information of the check byte. The selector unit 262 selects and outputs the output data sequence or the information of the check byte based on a signal from the counter 261 counting the bit positions of the output data sequence. The selector unit 262 functions as a data series generation module which generates the output data series by appending the check byte to the output data sequence.

The bit storage unit 263 is a shift register having FFs in number corresponding to the total number of the inversion information bits. The bit storage unit 263 shifts data according to an input enable from the counter 261. The bit storage unit 263 holds bits or bit sequences inserted in predetermined positions. When a bit where the inversion information bit is inserted is input, the counter 261 causes the bit storage unit 263 to receive data of the inversion information bit. The bit storage unit 263 operates only when the data is input.

The CRC checking unit 264 checks the CRC value appended to the data sequence from the selector unit 262. This CRC value is output from the CRC checking unit 264 to the determination unit 214.

Figure 11:
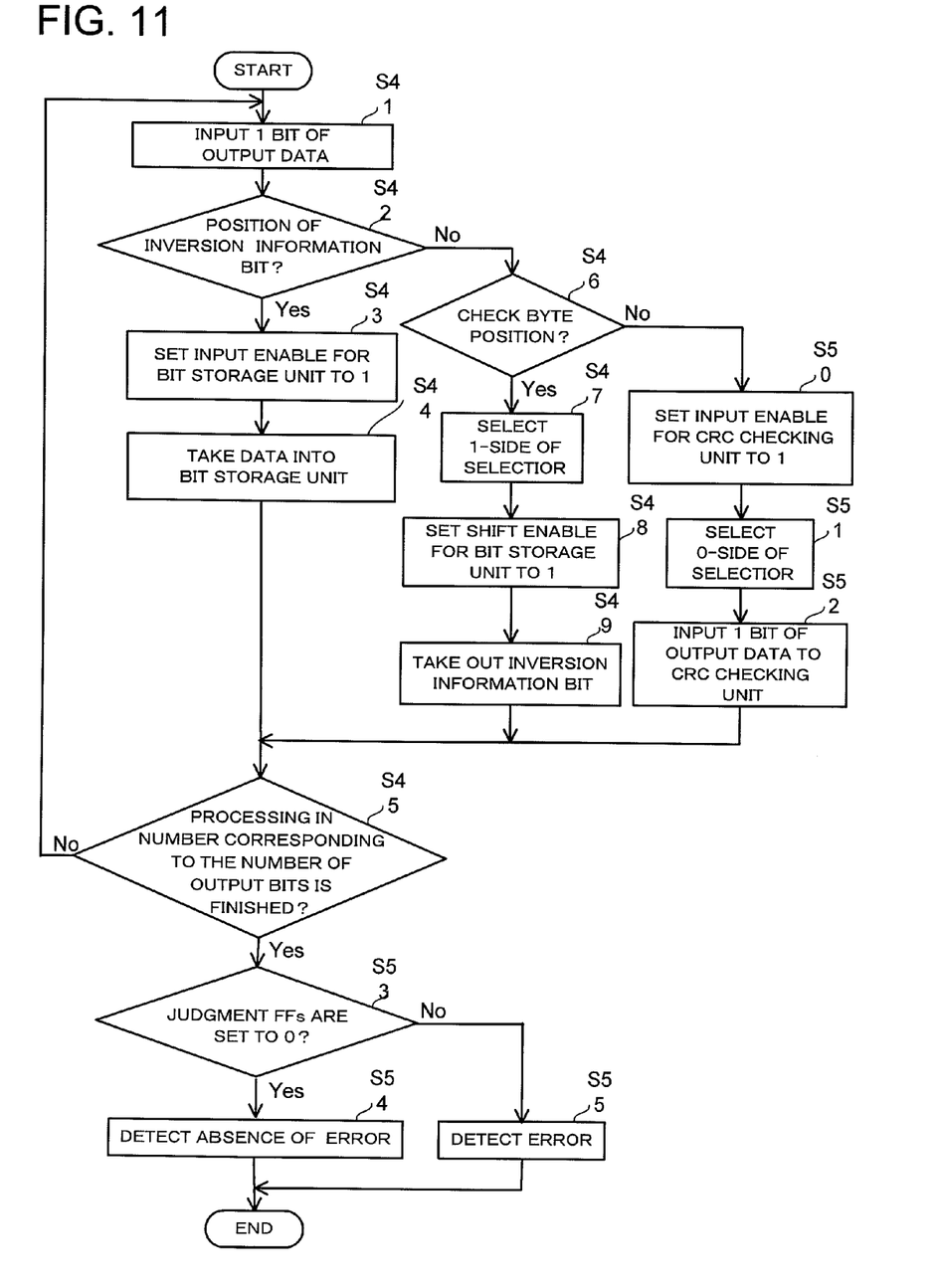
FIG. 11 is a flowchart showing an example of the operation procedure of the check byte checking unit.

Next, the operation procedure of the conversion unit 213 according to this embodiment will be described. FIG. 11 is a flowchart showing an example of the operation procedure of the check byte checking unit.

Figure 10:
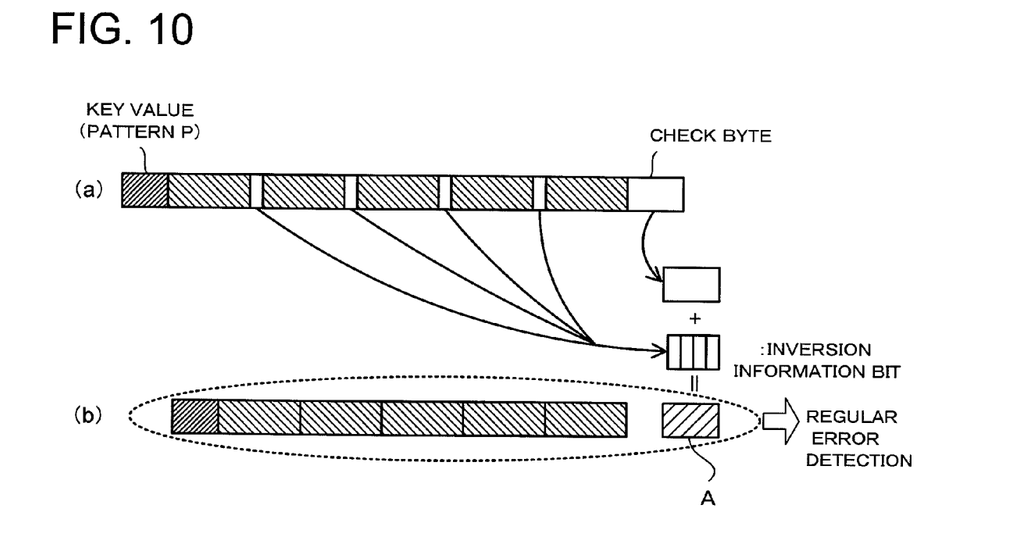
FIG. 10 is a chart showing the structures of data sequences in order to illustrate check byte generation according to the second embodiment of the present invention.

From the selector unit 254, the output data (see (a) in FIG. 10) having the data sequence resulting from the conversion by the data conversion unit 251 and the check byte generated by the check byte re-generation unit 253 is input bit by bit (Step S41).

The counter 261 determines whether or not the input bit is a bit where the inversion information bit is inserted (Step S42). The counter 261 performs the counting operation the number of times equal to the number of bits where the inversion information bits are inserted, and sets an input enable to 1 when the input bit is the inversion information bit (Step S43). Next, the counter 261 causes the inversion information bit to be taken into the bit storage unit 263 (Step S44).

Further, when the input bit is not a bit where the inversion information bit is inserted, the counter 261 determines whether or not its position is a check byte position (Step S46). When it is the check byte position, the counter 261 selects 1-side data of the selector unit 262 (Step S47) to set a shift enable, which is sent to the bit storage unit 263, to 1 (Step S48). The bit storage unit 263 takes out the inversion information bit (Step S49).

On the other hand, when the position is not the check byte position, the counter 261 determines that the position is another position of the data sequence. The counter 261 sets an input enable, which is sent to the CRC checking unit 264, to 1 (Step S50), so that a 0-side data of the selector unit 262 is selected (Step S51). The counter 261 causes the CRC checking unit 264 to receive one bit of the output data (Step S52).

Next, the counter 261 determines whether or not the processing in number corresponding to the number of output bits of the data conversion unit 221 and the bit storage unit 263 is finished (Step S45). When the processing in number corresponding to the number of the output bits of the data conversion unit 221 and the bit storage unit 263 has not been finished, the counter 261 returns to Step S41 to cause one bit of the output data to be input. The above-described operation is repeated until the input of all the data is finished. By such an operation, the data series (b) in FIG. 10 is input to the CRC checking unit 264. This series is identical with the data series shown in (b) in FIG. 4, for which the CRC is generated.

Then, the input of all the data is completed. At this completion instant, when values of judgment flip-flops (not shown) of the CRC checking unit 264 are all zero (Step S53), the CRC checking unit 264 detects the absence of an error (Step S54).

On the other hand, when the values of the judgment flip-flops of the CRC checking unit 264 are not all zero but are other values (Step S53), the CRC checking unit 264 detects an error (Step S55)

In this embodiment, the data is input to the check byte checking unit 255 bit by bit, but the conversion unit 213 can be structured such that a plurality of bits of the data are input to the check byte checking unit 255 each time. In any case, the conversion unit 213 may have any configuration that can realize the generation of the data sequence (b) in FIG. 10 and the input of the data sequence to the CRC checking unit.

As a result of such processing, it is possible to generate the check byte of the output data series without using data resulting from the conversion.

Further, the check byte of the output data series is also generated by using the data resulting from the conversion. By thus generating the check byte, it is possible to ensure that the input data series and the output data series before and after the data conversion by the data conversion unit 251 are identical. As a result, in this embodiment, a data conversion error in the data conversion unit 251 can also be detected.

It should be noted that the information recorder according to this embodiment is also applied to a case where it is detected whether or not data input to each data processing part subsequent to this conversion unit 213 has an error. For example, when data is input via a wiring line as an input unit to each processing block existing in the disk read/write control block 215, an error detector having this check byte checking unit is disposed. This check byte checking unit extracts a data series input from the input unit and detects an error based on this data series and the generated CRC value. Consequently, the error detector can confirm that the input data has no error every time it is input. That is, the disk read/write control block 215 functions as an extraction module extracting a bit sequence and as a detection module detecting the presence or absence of an error. Consequently, the error detector can confirm that there is no transistor trouble or the like in a route through which the input data previously passes. As a result, it is possible to immediately detect abnormality when data are found not identical due to the transistor trouble or the like.

Other Embodiments

Embodiments of the present invention are not limited to the above-described embodiments, and the embodiments can be expanded or modified. These expanded and modified embodiments are also included in the technical scope of the present invention.

What is claimed is:
1. A data converter, comprising:
an input module configured to input a first data series comprising a first data sequence and a first error detection code corresponding to a remainder of division of the first data sequence by a predetermined polynomial;
a conversion module configured to convert the first data sequence into a second data sequence by a process comprising an insertion of either an inversion information bit or an inversion information bit sequence;

a processing bit sequence generator configured to generate a processing bit sequence corresponding to the process based on the inserted inversion information bit or the inserted inversion information bit sequence;

a storing module configured to extract the inversion information bit from the generated processing bit sequence and to store the extracted inversion information bit; and a code generator configured to generate a second error detection code corresponding to the second data sequence based on an exclusive-OR of the stored inversion information bit and the first error detection code.

2. The data converter of claim 1, wherein the process comprises the insertion of a predetermined inversion information bit or inversion information bit sequence in a predetermined position of the first data sequence; and wherein the processing bit sequence generator is configured to generate the predetermined inversion information bit or inversion information bit sequence as the processing bit sequence.

3. The data converter of claim 1, wherein the process comprises the insertion of a predetermined inversion information bit sequence in a predetermined position of the first data sequence; and wherein the processing bit sequence generator is configured to generate a remainder of division of the predetermined inversion information bit sequence by the predetermined polynomial as the processing bit sequence.

4. The data converter of claim 1, wherein the process comprises the exchange of inversion information bits or inversion information bit sequences between two predetermined positions of the first data sequence, the processing bit sequence generator is configured to generate a first inversion information bit sequence in which "1" is set in the two predetermined positions, and the processing bit sequence generator is configured to generate a remainder of division of the first inversion information bit sequence by the predetermined polynomial as the processing bit sequence when the inversion information bits or the inversion information bit sequences in the two predetermined positions are different.

5. The data converter of claim 1, wherein the process comprises the inversion of an inversion information bit or an inversion information bit sequence in a predetermined position of the first data sequence, and wherein the processing bit sequence generator is configured to generate a second inversion information bit sequence in which "1" is set only in the predetermined position and to generate a remainder of division of the second inversion information bit sequence by the predetermined polynomial as the processing bit sequence.

6. The data converter of claim 1, wherein the process comprises the exclusive-OR of the first data sequence and a predetermined inversion information bit or inversion information bit sequence in a predetermined position; and wherein the processing bit sequence generator is configured to generate a third inversion information bit sequence in which the predetermined inversion information bit or inversion information bit sequence is set in the predetermined position and to generate a remainder of division of the third inversion information bit sequence by the predetermined polynomial as the processing bit sequence.

7. The data converter of claim 1, wherein the process comprises a combination of the insertion of the inversion information bit or the inversion information bit sequence and any plural processing operations among the exchange, and the inversion of the inversion information bit or the inversion information bit sequence and the exclusive-OR of the predetermined inversion information bit or bit inversion information sequence; and wherein the processing bit sequence generator is configured to generate a plurality of the processing bit sequences corresponding to the plural processing operations respectively, to calculate an exclusive-OR of the plural processing bit sequences, and to generate a remainder of division of the exclusive-OR by the predetermined polynomial, as the processing bit sequence.

8. The data converter of claim 1, further comprising:

a second code generator configured to generate a third error detection code for the second data sequence; and a comparison module configured to compare the second and third error detection codes.

9. An information recorder, comprising:

the data converter of claim 8; and a writer module configured to write a data series comprising the second data sequence and either the second error detection code or a third error detection code to a recording medium.

10. The data converter of claim 1, further comprising:

a data series generator configured to generate a second data series by appending the second error detection code to the second data sequence; and an error detection module configured to detect an error of the second data series by using the second error detection code.

11. An error detector, comprising:

an input module configured to input a second data series comprising a second data sequence and a first error detection code for a first data sequence, the second data sequence generated by conversion by a process comprising either insertion of an inversion information bit or an inversion information bit sequence to the first data sequence, the first error detection code corresponding to a remainder of division of the first data sequence by a predetermined polynomial;

a storing module configured to extract the inversion information bit from the second data series and to store the extracted inversion information bit;

a code generator configured to generate a second error detection code corresponding to the second data sequence based on an exclusive-OR of the stored inversion information bit and the first error detection code; and a detection module configured to detect presence or absence of an error in the second data sequence by using the second error detection code.

12. A data conversion method, comprising:

inputting a first data series comprising a first data sequence and a first error detection code corresponding to a remainder of division of the first data sequence by a predetermined polynomial;

converting the first data sequence into a second data sequence by a process comprising an insertion of an inversion information bit or an inversion information bit sequence;

generating a processing bit sequence based on the inserted inversion information bit or the inserted inversion information bit sequence;

extracting the inversion information bit from the generated processing bit sequence and storing the extracted inversion information bit; and generating a second error detection code corresponding to the second data sequence based on an exclusive-OR of the stored inversion information bit and the first error detection code.

13. An error detection method, comprising:

inputting a second data series comprising a second data sequence and a first error detection code for a first data sequence, the second data sequence generated by conversion with a process comprising insertion of an inversion information bit or an inversion information bit sequence to the first data sequence, the first error detection code corresponding to a remainder of division of the first data sequence by a predetermined polynomial;

extracting the inversion information bit from the second data series and storing the extracted inversion information bit;

generating a second error detection code corresponding to the second data sequence based on an exclusive-OR of the stored inversion information bit and the first error detection code; and detecting presence or absence of an error in the second data sequence by using the second error detection code.

* * * * *